United States Patent
Baba et al.

(10) Patent No.: US 6,252,389 B1
(45) Date of Patent: Jun. 26, 2001

(54) CURRENT DETECTOR HAVING MAGNETIC CORE FOR CONCENTRATING A MAGNETIC FLUX NEAR A HALL-EFFECT SENSOR, AND POWER SWITCH APPARATUS INCORPORATING SAME

(75) Inventors: Sadaaki Baba; Satoru Inoue, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/156,392

(22) Filed: Sep. 18, 1998

(30) Foreign Application Priority Data

Mar. 18, 1998 (JP) .................................................. 10-068341

(51) Int. Cl.[7] ........................ G01R 19/15; G01R 19/165; G01R 33/07; H01H 47/00
(52) U.S. Cl. ..................... 324/117 H; 324/251; 327/511; 335/18; 361/187
(58) Field of Search ............................ 324/207.2, 117 R, 324/117 H, 235, 252; 323/294, 368; 327/511; 361/57, 93.1, 187; 335/18

(56) References Cited

U.S. PATENT DOCUMENTS

| | | | |
|---|---|---|---|
| 3,185,920 | * | 5/1965 | Brunner ......................... 324/207.2 X |
| 3,199,630 | * | 8/1965 | Engel et al. ................... 324/207.2 X |
| 4,283,643 | * | 8/1981 | Levin ............................... 324/117 H |
| 4,394,619 | * | 7/1983 | Gschwandtner ................. 327/117 H |
| 4,639,665 | * | 1/1987 | Gary .................................. 324/117 H |
| 4,692,703 | * | 9/1987 | Extrance et al. ............. 324/117 H X |
| 4,749,939 | * | 6/1988 | Seitz ................................. 324/117 H |
| 4,893,073 | * | 1/1990 | McDonald et al. .............. 324/117 H |
| 5,942,895 | * | 8/1999 | Popovic et al. .............. 324/117 H X |

FOREIGN PATENT DOCUMENTS 4-27653    5/1992    (JP) .............................. H01H/50/30

* cited by examiner

*Primary Examiner*—Gerard R. Strecker
(74) *Attorney, Agent, or Firm*—Sughrue, Mion, Zinn, Macpeak & Seas, PLLC

(57) ABSTRACT

A current detector includes a Hall-effect device 18 for detecting a magnetic field generated by a current flowing across a conducting portion; a magnetic core 19 having a first end face for concentrating a magnetic flux and a second end face having a smaller area than the first end face, only the second end face being disposed at a position in close proximity to or in abutment against a magnetic field detecting surface of the Hall-effect device; and a signal processing circuit 26 for processing an output signal from the Hall-effect sensor 18 into a signal representing the current flowing across the conducting portion.

12 Claims, 8 Drawing Sheets

CURRENT DETECTOR HAVING MAGNETIC CORE FOR CONCENTRATING A MAGNETIC FLUX NEAR A HALL-EFFECT SENSOR, AND POWER SWITCH APPARATUS INCORPORATING SAME

BACKGROUND OF THE INVENTION

1. Field of the Invention

The present invention relates to a current detector for detecting a current in a main circuit of a power switching apparatus and to a power switching apparatus having the function of protecting an apparatus or a device under a load due to an overcurrent.

2. Description of the Related Art

A power switching apparatus is used to open or close an electric path between a single- or three-phase power source and an apparatus or a device under a load as a fixed contact and a movable contact are made to open or close by driving an iron core and the movable contact leading thereto by energization of an electromagnetic coil.

FIG. 9 is a partially sectional view of a conventional power switching apparatus shown in Japanese Patent No. 1,751,690, and FIG. 10 is a partially sectional front view of the power switching apparatus.

In FIG. 9, a base 1 and a mounting base 2, which are formed of an insulating material, constitute a casing for fixing and holding internal component parts. An operating-coil driving circuit board 6 has a circuit for converting a signal supplied from an external power source to a coil driving signal. An operating coil 5 drives an iron core through a magnetic field generated by the coil driving signal. A fixed core 4 and a movable core 3 form magnetic paths for the magnetic field generated by the operating coil 5, and the movable core 3 is attracted to the fixed core 4 by the electromagnetic force acting in the gap between the fixed core 4 and the movable core 3.

A movable contact 9, which is connected to the movable core 3, comes into contact with a fixed contact 8 through the action of the movable core 3. As a result, a fixed contact point 11 and a movable contact point 12 attached to the contacts come into contact with each other, thereby making the electric path.

When the operating-coil driving signal is off, the driving force of the operating coil 5 is not present, and the movable core 3 and the fixed core 4 are separated by the force of a tripping spring 7, so that the fixed contact point 11 and the movable contact point 12 are separated, thereby breaking the electric path.

Incidentally, a terminal screw 10 connects an electric wire from an external circuit to the fixed contact 8.

FIG. 11 shows the structure of a conventional current transformer type current detector, and FIG. 12 shows the structure of a conventional Hall-effect type current detector.

In the drawings, a conducting portion 13 and a terminal screw 14 are for allowing the current sensor to be energized by the current of the apparatus or device under the load, a current transformer 15 is for detecting the current at the conducting portion 13, and an output line 16 outputs the current from a secondary winding of the current transformer 15.

A magnetic core 17 is formed of a magnetic material disposed around the conducting portion 13, and allows the magnetic flux generated by the current flowing across the conducting portion 13 to flow therethrough. The magnetic field is detected by a Hall-effect device 18, and is outputted as a current signal.

With the conventional current detectors, the current is detected by the through type current transformer or by the magnetic core having a gap and the Hall-effect sensor disposed in the gap. In either method, it is necessary to form the closed loop in which the core of the current transformer or the magnetic core serving as a passage for the magnetic flux is disposed around the conducting portion. As a result, the magnetic core becomes larger than the current sensor, so that the current detector is difficult to be built into a power switching apparatus.

In addition, since it is necessary to provide the magnetic core around the conductive portion, it is necessary to use a small-diameter conducting portion and pass it through the magnetic core during the assembly into a product. Hence, there is a problem in that after the terminal screw is fitted, the conducting portion cannot be built into the product.

Furthermore, in an area where the working current is large, the conducting portion becomes large, so that the magnetic core is also bound to be large in shape. Additionally, it is necessary to make the sectional area of the magnetic core large to prevent the magnetic saturation in the large current area, with the result that the magnetic core tends to become large, and higher cost of the current sensor portion is entailed.

In addition, the conventional current detector is difficult to be built into the power switching apparatus, and it has been difficult for the power switching apparatus to be provided with the functions of protecting the apparatus or device under the load, monitoring the operation of the apparatus or device under the load, and detecting a fault of the power switching apparatus.

SUMMARY OF THE INVENTION

The present invention has been devised to overcome the above-described problems, and its object is to obtain a compact current detector in which a current detection circuit is made compact and a power switching apparatus provided with the functions of protecting an apparatus or a device under a load, monitoring the operation of the apparatus or device under the load, and detecting a fault of the power switching apparatus.

In order to solve the above object, according to the present invention, there is provided a current detector comprising: a Hall-effect sensor for detecting a magnetic field generated by a current flowing across a conducting portion; a magnetic core having a first end face for concentrating a magnetic flux and a second end face having a smaller area than the first end face, only the second end face being disposed at a position in close proximity to or in abutment against a magnetic field detecting surface of the Hall-effect sensor; and a signal processing circuit for processing an output signal from the Hall-effect sensor into a signal representing the current flowing across the conducting portion.

In addition, there are provided a pair of magnetic cores having their second end faces respectively disposed at the positions in close proximity to or in abutment against magnetic field detecting surfaces of the Hall-effect sensor on both sides thereof.

In addition, a flat plate-shaped magnetic core whose longitudinal direction is set in an energizing direction of the conducting portion, whose sectional area changes toward a position of the magnetic field detecting surface of the Hall-effect sensor, and which is arranged along a configuration of a surface of the conducting portion is disposed in close proximity to or in abutment against the conducting portion.

In addition, there are provided a pair of magnetic cores having their second end faces respectively disposed at the positions close to or contacting magnetic field detecting surfaces of the Hall-effect sensor on both sides thereof, and a distance between two mutually opposing surfaces of the pair of magnetic cores is arranged to be smaller than their spaced-apart dimension with respect to another magnetic member disposed in close proximity to the pair of magnetic cores.

In addition, a U-shaped conducting portion is provided, and the magnetic core and the Hall-effect sensor are provided on an inner surface of a U-shaped portion of the U-shaped conducting portion.

In addition, the magnetic core is disposed on three surfaces of a flat-shaped conductor.

In addition, in accordance with the present invention, there is provided a power switching apparatus having a current detector, characterized in that an output signal of a Hall-effect sensor passed through a temperature compensating circuit is set as a first output signal, the first output signal is processed into a current signal as a second output signal which is not subjected to temperature compensation, the first and second output signals are subjected to subtraction processing, and an output signal of a result of the processing is set as a signal proportional to a temperature of a terminal, so as to detect an abnormality in the temperature of a terminal portion and a conducting portion and protect against a state of abnormal operation.

In addition, when the output signal passed through the temperature compensating circuit of the Hall-effect sensor has exceeded a predetermined value, the first and second output signals are subjected to subtraction processing as the signal proportional to the temperature, and the output signal of the result of the processing is set as the signal proportional to the temperature of the terminal.

DETAILED DESCRIPTION OF THE PREFERRED EMBODIMENTS

Now, a description will be given in more detail of preferred embodiments of the present invention with reference to the accompanying drawings.

First Embodiment

Figure 1:
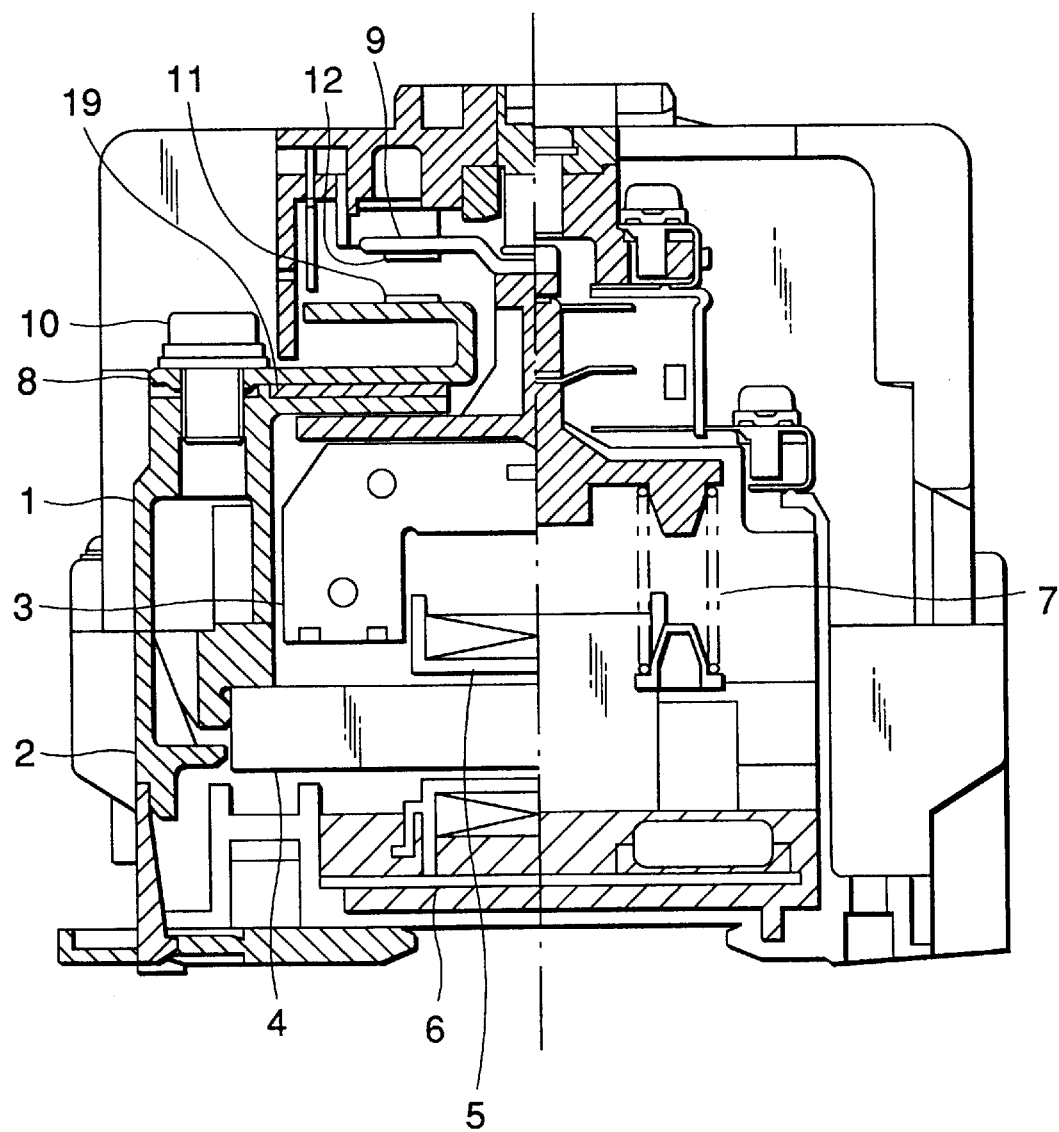
FIG. 1 is a cross-sectional view illustrating an embodiment of a power switching apparatus.
Figure 2:
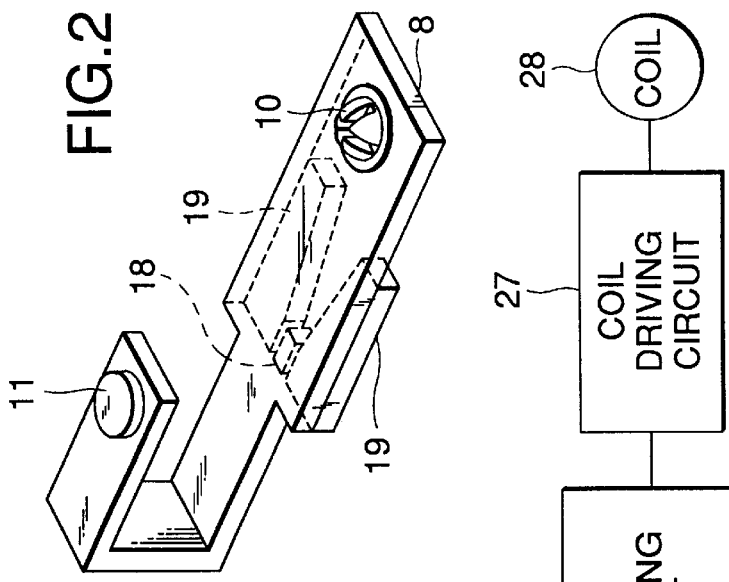
FIG. 2 is a partial enlarged view illustrating a current sensor in accordance with a first embodiment of the present invention.
Figure 3:
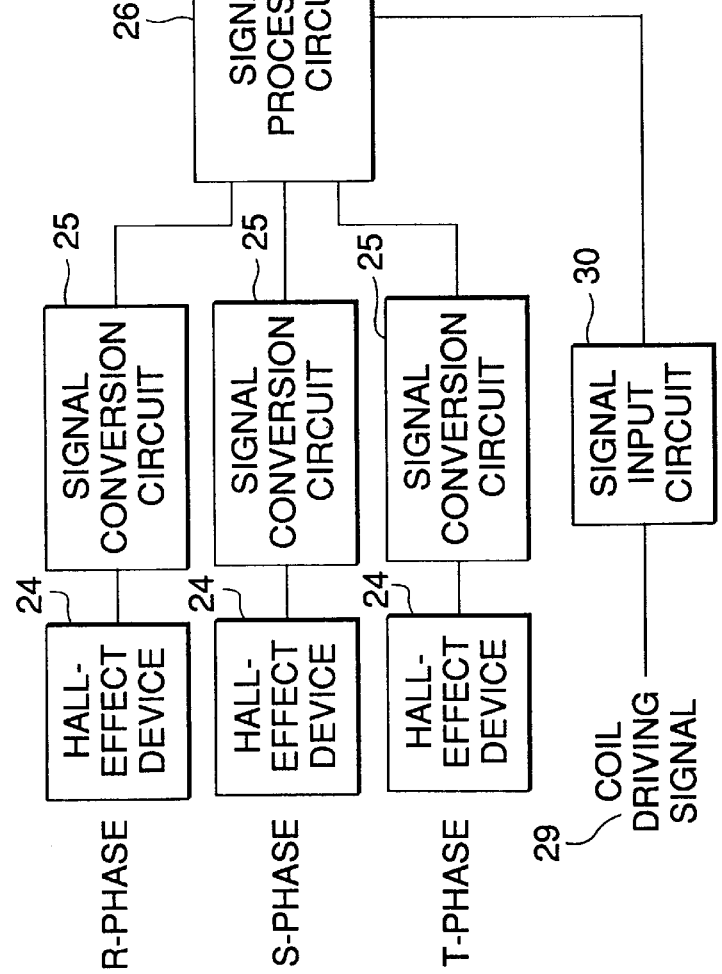
FIG. 3 is a block diagram of a current detection circuit of the power switching apparatus in accordance with the first embodiment of the present invention.

Referring to FIGS. 1 to 3, a description will be given of a current detector in accordance with a first embodiment of the present invention. FIG. 1 is a cross-sectional view illustrating the current detector in accordance with the first embodiment of the present invention, and FIG. 2 is a partial enlarged view illustrating a structure for attaching a current sensor. FIG. 3 is a block diagram illustrating a signal processing circuit of a power switching apparatus.

A description will be given of FIGS. 1 and 2. Those component parts that are identical or equivalent to those in the drawings illustrating the conventional example will be denoted the same reference numerals, and a description of overlapping portions of the operation will also be omitted herein.

A magnetic core 19, i.e., a pair of cores having a bilaterally symmetrical shape, is a magnetic material attached to a reverse surface of a fixed contact 8 in such a manner as to extend in the longitudinal direction thereof and having a slender shape in its central portion. A Hall-effect device 18 is located in the center of the magnetic core 19 to detect the magnetic flux passing through the magnetic core 19, and the Hall-effect device 18 is disposed on the reverse surface of the fixed contact 8 and is accommodated between that reverse surface of the fixed contact 8 and a base 1 of the power switching apparatus. A signal proportional to the current flowing across the fixed contact 8 is obtained by this Hall-effect device 18.

The magnetic flux is generated by the current flowing across the fixed contact 8 in an amount corresponding to the length of the magnetic core 19 depending on the trapezoidal shape of the magnetic core 19. This magnetic flux is concentrated in the position where the Hall-effect device 18 is attached, and the sensitivity of detection of the magnetic flux is improved.

Since the structure adopted is such that the magnetic core 19 and the Hall-effect device 18 are disposed on one side of the fixed contact 8, and the current sensor section and the fixed contact section can be manufactured separately, the manufacturing efficiency improves.

Referring to FIG. 3, a description will be given of the internal processing for detection of the current. The electrical signal obtained by a Hall-effect device 24 is converted by a signal conversion circuit 25 into a necessary signal level for a signal processing circuit 26 in an ensuing stage, and is inputted to the signal processing circuit 26. In addition, a coil driving signal 29 from an external circuit is converted by a signal input circuit 30 into a necessary level for the signal processing circuit 26, and is inputted to the signal processing circuit 26.

On the basis of the current information on an apparatus or a device under a load from the current sensor as well as the state of input of a signal for driving the operating coil of the power switching apparatus, the signal processing circuit 26 effects arithmetic processing for protecting the apparatus or device under the load, monitoring the operation of the apparatus or device under the load, and detecting a fault of the power switching apparatus. As a result of the processing, the signal processing circuit 26 outputs a control signal for controlling the operating coil to a coil driving circuit 27, and energizes or de-energizes an operating coil 28. Consequently, the contact points of the power switching apparatus are opened or closed to allow the apparatus or device under the load to be switched on or off from the electrical path.

Second Embodiment

Figure 4:
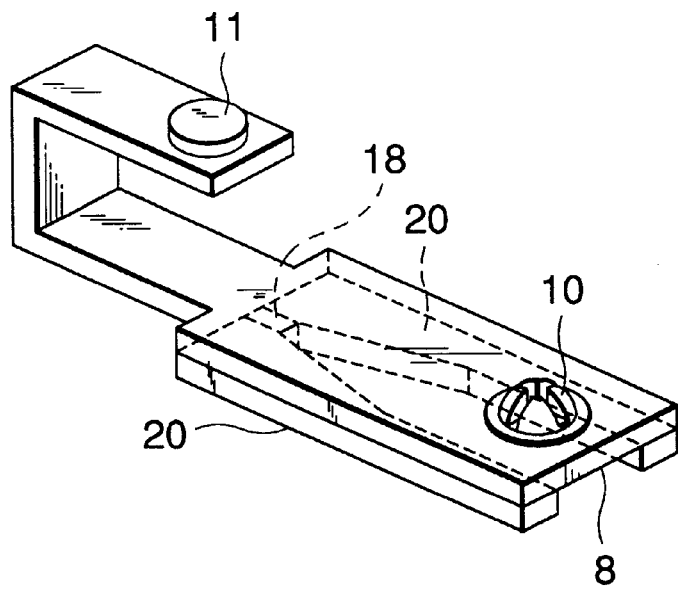
FIG. 4 is a partial enlarged view illustrating the current sensor in accordance with a second embodiment of the present invention.

Next, referring to FIG. 4, a description will be given of the current detector in accordance with a second embodiment of the present invention. FIG. 4 is a partial enlarged view of a structure for attaching the current sensor, and illustrates the structure of a magnetic core 20 and the Hall-effect device 18 in accordance with the second embodiment.

The magnetic core 20 is disposed on the reverse surface of the fixed contact 8, and the structure provided is such that the reverse surface of a terminal screw 10 of the fixed contact 8 is removed, and the magnetic core 20 extends to the position of the terminal screw serving as another magnetic member. The Hall-effect device 18 is disposed at an end face of the magnetic core 20 where the magnetic flux is concentrated.

As a result, it is possible to allow the magnetic flux of the current flowing across the fixed contact 8 to be concentrated, thereby making it possible to improve the current detection sensitivity of the Hall-effect device 18.

Third Embodiment

Figure 5:
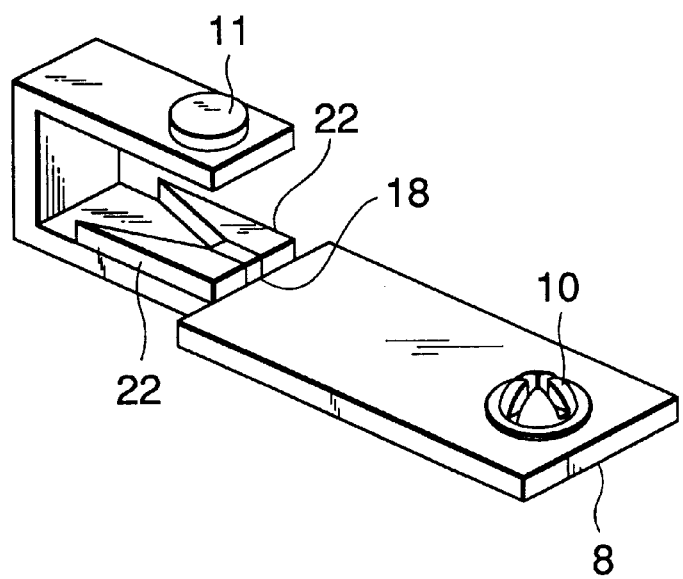
FIG. 5 is a partial enlarged view illustrating the current sensor in accordance with a third embodiment of the present invention.

Next, referring to FIG. 5, a description will be given of the current detector in accordance with a third embodiment of the present invention. FIG. 5 is a partial enlarged view of a structure for attaching the current sensor, and illustrates the structure of a magnetic core 22 and the Hall-effect device 18 in accordance with the third embodiment.

The magnetic core 22 is structured such that a reduced sectional portion where the magnetic flux of the energizing current of the fixed contact 8 is concentrated is provided on an inner side of a U-shaped portion of the U-shaped fixed contact 8, and the Hall-effect device 18 is disposed on the portion where the magnetic flux is concentrated.

As a result, the magnetic flux occurring due to the current in the lower conducting portion of the fixed contact 8 and the magnetic flux occurring due to the reverse current flowing across the upper conducting portion of the fixed contact 8 where a fixed contact point 11 is attached are combined for the magnetic core 22 and the Hall-effect device 18. hence, a large magnetic flux is generated as compared with the case where the current flows only in one direction.

For this reason, it is possible to increase the amount of the magnetic flux of the current generated in the magnetic core 22, so that it is possible to improve the current detection sensitivity of the Hall-effect device 18.

Fourth Embodiment

Figure 6:
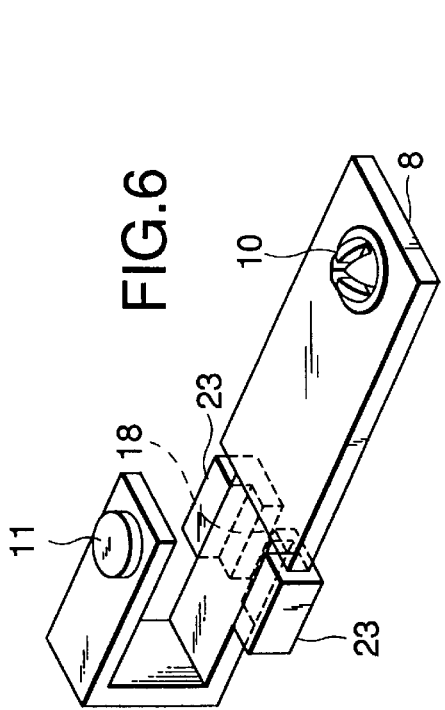
FIG. 6 is a partial enlarged view illustrating the current sensor in accordance with a fourth embodiment of the present invention.

Next, referring to FIG. 6, a description will be given of the current detector in accordance with a fourth embodiment of the present invention. FIG. 6 is a partial enlarged view of a structure for attaching the current sensor, and illustrates the structure of a magnetic core 23 and-the Hall-effect device 18 in accordance with the fourth embodiment.

The magnetic core 23 is disposed on the reverse surface of the fixed contact 8, and is structured such that a pair of left and right magnetic cores 23 each having an L-shaped cross section in which a rising portion is provided by the portion of the plate thickness of the conducting material of the fixed contact 8, and the Hall-effect device 18 is disposed on the portion where the magnetic flux is concentrated.

As a result, in the magnetic core 23 and the Hall-effect device 18, the magnetic flux occurring due to the current in the fixed contact 8 first passes through the inner portion of the magnetic core around the fixed contact 8, then passes through the rising portion of one L-shaped magnetic core, and enters the rising portion of the other L-shaped magnetic core on the upper side of the fixed contact. Consequently, the magnetic flux occurring in the fixed contact 8 exerts less influence on the current sensor disposed on the fixed contact 8 located in close proximity thereto, and the effect of other phases is also reduced.

For this reason, it is possible to reduce the effect of the amount of generation of the magnetic fluxes of the other phases of the three-phase current, and reduce the error in the current of the installed phase of the current sensor, thereby making it possible to improve the current detection accuracy of the Hall-effect device 18.

Fifth Embodiment

Figure 7:
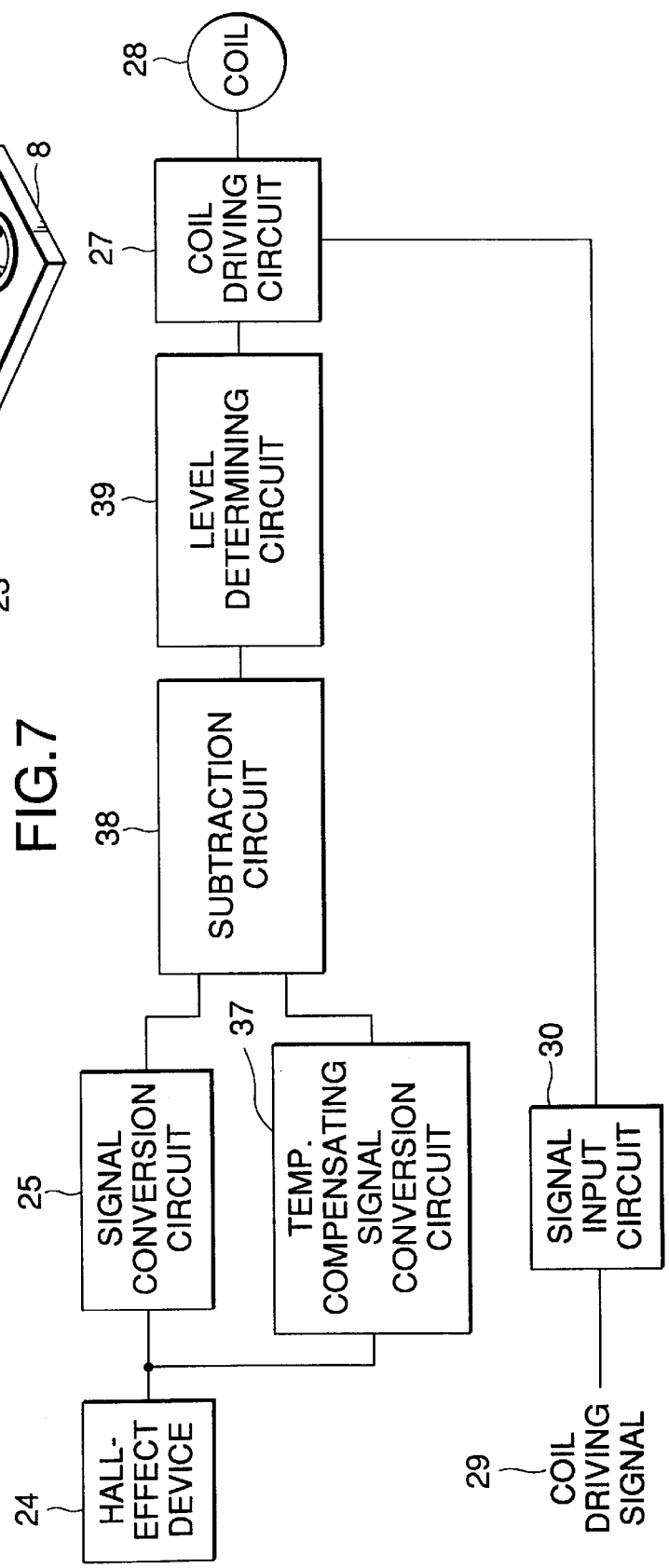
FIG. 7 is a block diagram of a temperature protection circuit of the power switching apparatus in accordance with a fifth embodiment of the present invention.

Next, referring to FIG. 7, a description will be given of the power switching apparatus in accordance with a fifth embodiment of the present invention. FIG. 7 is a block diagram of a detection and processing circuit of an embodiment of a power switching apparatus having the function of detecting an abnormality in the temperature of a connecting terminal of the power switching apparatus in accordance with the present invention.

An output signal from the Hall-effect device 24 is inputted to the signal conversion circuit 25 and a temperature compensating-type signal conversion circuit 37, which convert the output signal from the Hall-effect device 24 into signal levels necessary for a processing circuit in an ensuing stage. Output signals obtained by the signal conversion circuit 25 and the temperature compensating-type signal conversion circuit 37 are inputted to a subtraction circuit 38 which outputs as its output signal a signal representing the difference between the two signals inputted thereto. The output level from the subtraction circuit 38 is determined by a level determining circuit 39 which determines that the temperature of the fixed contact has exceeded a preset value when that output level has exceeded a predetermined value, in which case the level determining circuit 39 outputs a signal for canceling the energization of the coil to the coil driving circuit 27 so as to de-energize the operating coil 28. Thus, it is possible to detect the occurrence of an abnormality which can lead to a burning incidence on the basis of the abnormality in the temperature of the terminal of the power switching apparatus, thereby making it possible to prevent the occurrence of such an incidence.

There is a difference in the conversion ratio between the signal conversion circuit 25 and the temperature compensating-type signal conversion circuit 37 depending on the working temperature, and when the same signal is inputted, a difference is produced between the output signals from the two circuits, making it possible to detect the temperature.

An abnormal temperature rise can occur in the fixed contact 8 due to such as the energization of the power switching apparatus with an overcurrent and the loosening of a terminal screw, possibly leading the burning of the power switching apparatus, an electric wire connected thereto, and a control panel. Hence, the present invention offers a large meritorious effect.

Sixth Embodiment

Figure 8:
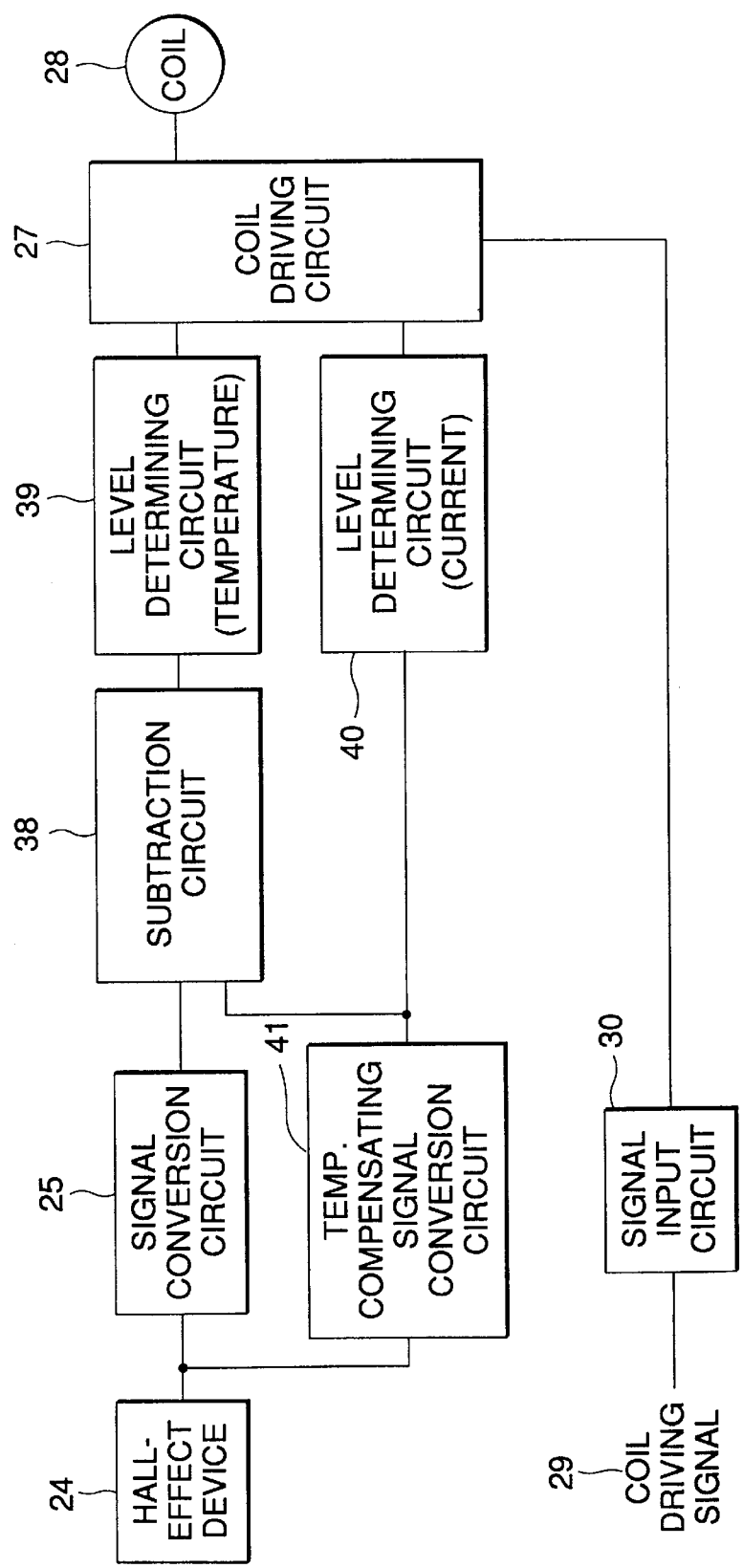
FIG. 8 is a block diagram of a temperature protection circuit of the power switching apparatus in accordance with a sixth embodiment of the present invention.
Figure 9:
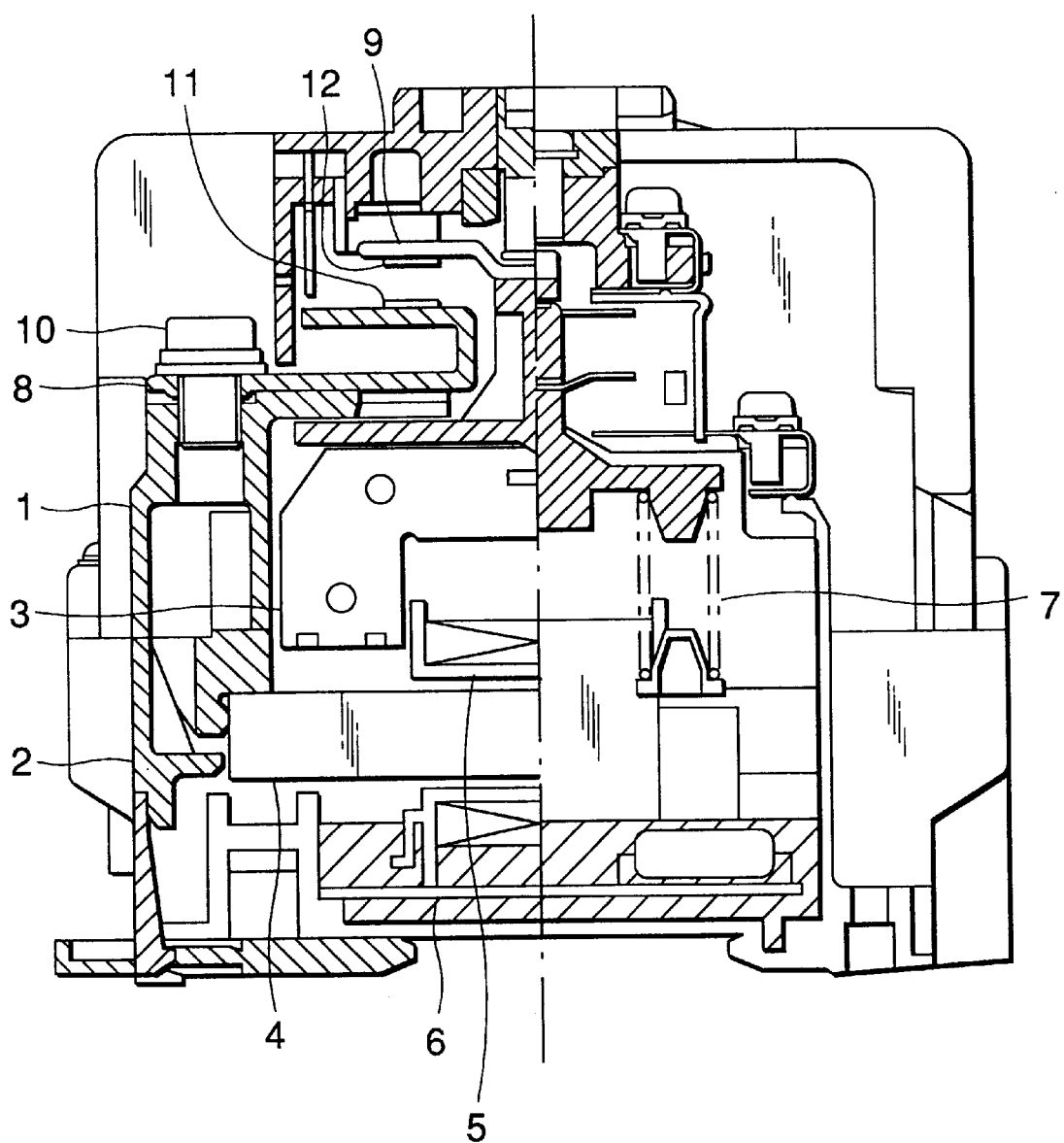
FIG. 9 is a plan view, partly in section, illustrating a conventional power switching apparatus.
Figure 10:
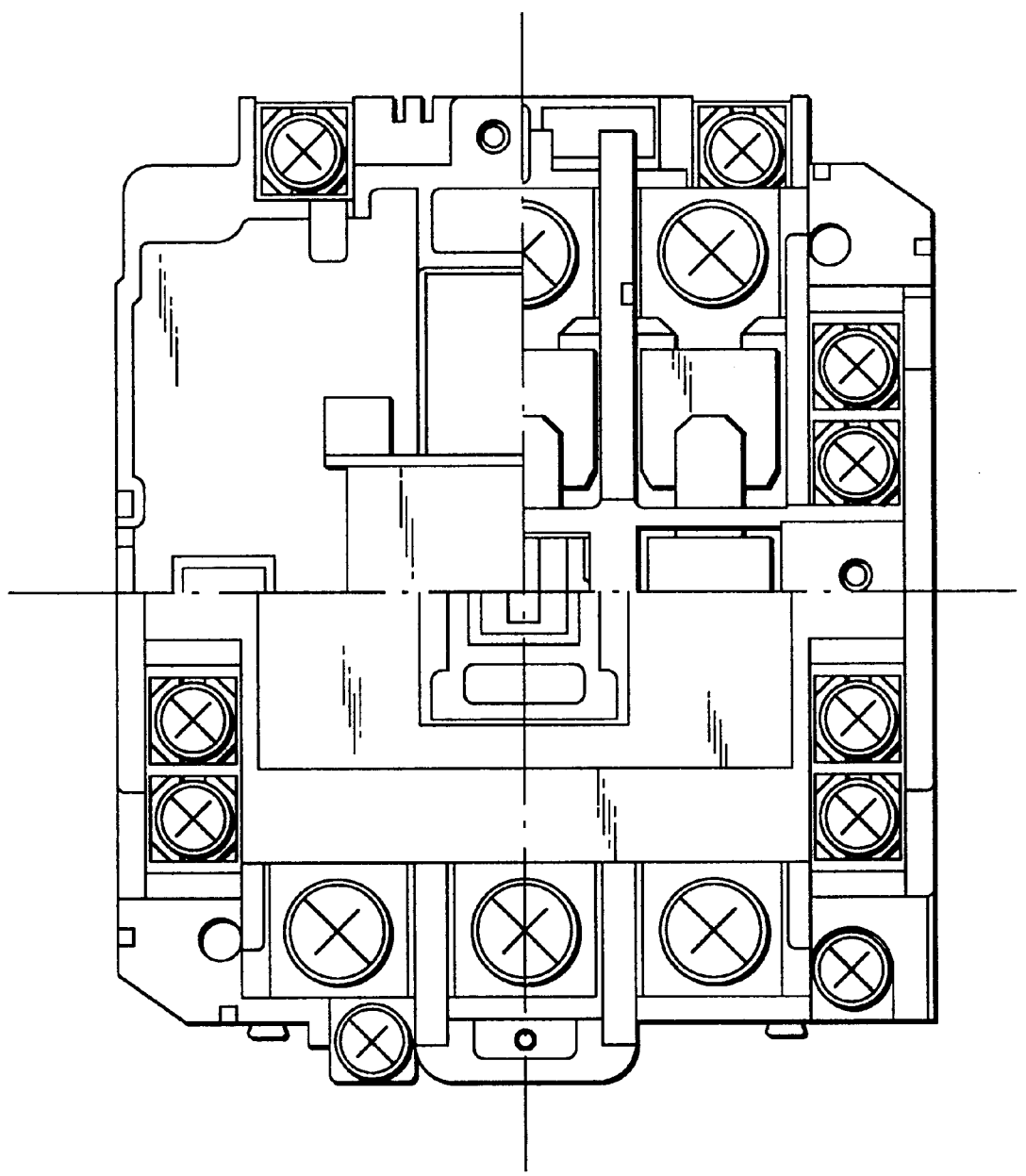
FIG. 10 is a cross-sectional view illustrating the conventional power switching apparatus.
Figure 11:
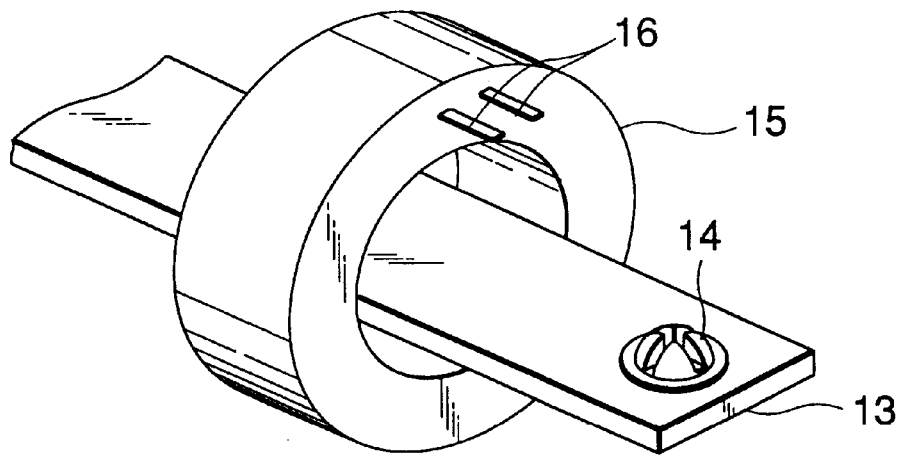
FIG. 11 is a diagram illustrating a conventional current transformer type current sensor.
Figure 12:
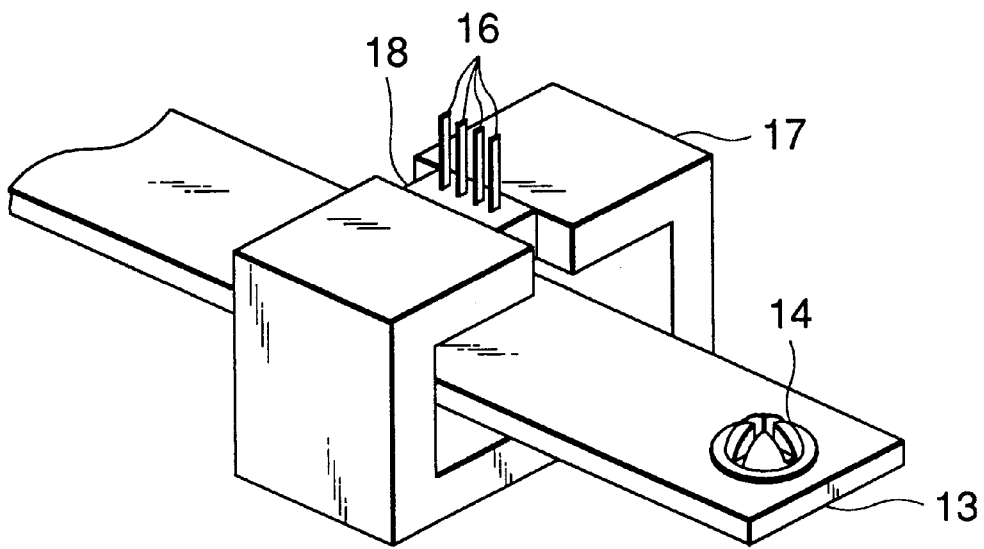
FIG. 12 is a diagram illustrating a conventional Hall-effect device type current sensor.

Next, referring to FIG. 8, a description will be given of the power switching apparatus in accordance with a sixth embodiment of the present invention. FIG. 8 is a block diagram of a detection and processing circuit of another embodiment of the power switching apparatus having the function of detecting an abnormality in the temperature of a connecting terminal of the power switching apparatus in accordance with the present invention.

An output signal from the Hall-effect device 24 is inputted to the signal conversion circuit 25 and a temperature compensating-type signal conversion circuit 41, which convert the output signal from the Hall-effect device 24 into signal levels necessary for a processing circuit in an ensuing stage. Output signals obtained by signals obtained by the signal conversion circuit 25 and the temperature compensating-type signal conversion circuit 41 are inputted to a subtraction circuit 38 which outputs as its output signal a signal representing the difference between the two signals inputted thereto. The output level from the subtraction circuit 38 is determined by the temperature-level determining circuit 39 which determines that the temperature of the fixed contact has exceeded a preset value when that output level has exceeded a predetermined value. The output signal obtained from the temperature compensating-type signal conversion circuit 41 is further supplied to a current-level determining circuit 40 as a current signal, and the current-level determining circuit 40 determines that the circuit current has exceeded a preset value when that current level has exceeded a predetermined value. When the signals from the temperature-level determining circuit 39 and the current-level determining circuit 40 have occurred at the same time, a signal for canceling the energization of the coil is outputted to the coil driving circuit 27 so as to de-energize the operating coil 28. Thus, the power switching apparatus operates so as to detect the occurrence of an abnormality which can lead to a burning incidence on the basis of the abnormality in the temperature of the terminal of the power switching apparatus, thereby making it possible to prevent the occurrence of such an incidence.

There is a difference in the conversion ratio between the signal conversion circuit 25 and the temperature compensating-type signal conversion circuit 41 depending on the working temperature, and when the same signal is inputted, a difference is produced between the output signals from the two circuits, making it possible to detect the temperature. At the same time, a temperature-compensated current signal is obtained from the output from the temperature compensating-type signal conversion circuit 41, so that it is possible to reliably detect a situation where the temperature of the fixed contact is high, and the circuit current is large, which can lead to a burning incidence.

As described above, in accordance with the present invention, it is possible to make the current sensor compact and fit the current sensor into the power switching apparatus, and since the protecting function can be incorporated into the power switching apparatus, the arrangement in the control panel can be simplified.

In claim 1, the magnetic core is formed into a shape in which its cross-sectional area changes in a direction toward a magnetic flux, the magnetic flux is efficiently concentrated in the Hall-effect sensor portion, and the current can be detected efficiently. Further, since a partial magnetic core which is attached to a portion of the conducting portion is used, the current sensor can be made compact. In addition, since the magnetic core is provided around the conducting portion, the magnetic flux due to the current in the conducting portion can be concentrated in the Hall-effect sensor portion. Hence, the apparatus can be made less susceptible to the effect of a magnetic flux due to the current in another conducting portion, so that it is possible to improve the accuracy of the current signal.

In addition, since the magnetic core is provided on both sides of the Hall-effect sensor, the magnetic flux can be concentrated efficiently, and efficient current detection is made possible, so that the magnetic core can be made compact, and a low-cost product can be realized.

In addition, a flat plate-shaped magnetic core conforming to the shape of the conducting portion is used, so that the shape of the magnetic core can be made suitable to the shape of the conducting portion, and a compact current detector can be realized.

In addition, even if another magnetic member such as a terminal screw is present in the vicinity of the magnetic core, the current can be detected without being affected by such a magnetic member, and a compact external -size of the product can be realized.

In addition, as a result of the use of the U-shaped conducting portion, the magnetic flux on the inner side of the U-shaped portion can be strengthened by the two-way circuit of the circuit current, so that the circuit current can be detected efficiently, and a low-cost product can be realized through such as the compact size of the magnetic core.

In addition, since the three sides of the flat plate-shaped conducting portion are covered with the magnetic core, the magnetic flux around the conducting portion passes through the magnetic core, so that the amount of magnetic flux leaking to other portions can be reduced. hence, it is possible to detect the current efficiently, and a low-cost product can be realized through such as the compact size of the magnetic core.

In addition, an abnormality in the temperature of a terminal of the switching apparatus can be detected by detecting the temperature of the terminal by the Hall-effect sensor for current detection.

In addition, since the level of the current signal is detected in detecting the temperature of the terminal by the Hall-effect sensor for current detection, a circuit for amplifying a very weak signal, and the detection circuit can be realized simply at low cost.

What is claimed is:

1. A current detector comprising:
a Hall-effect sensor for detecting a magnetic field generated by a current flowing across a conductor;
a magnetic core for concentrating a magnetic flux created by the magnetic field and having a first end face and a second end face opposite said first end face, said second end face having a smaller area than said first end face, only said second end face being disposed at a position in close proximity to or in abutment against a magnetic field detecting surface of said Hall-effect sensor; and
a signal processing circuit for processing an output signal from said Hall-effect sensor into a signal representing the current flowing across said conductor; and
wherein said magnetic core is a flat plate-shaped magnetic core whose longitudinal direction is set in an energizing direction of said conductor, whose sectional area changes toward a position of the magnetic field detecting surface of said Hall-effect sensor, and which is arranged along a configuration of a surface of said conductor so as to be disposed in close proximity to or in abutment against said conductor.

2. The current detector according to claim 1, wherein there are provided a pair of magnetic cores having their second end faces respectively disposed at the positions in close proximity to or in abutment against magnetic field detecting surfaces of said Hall-effect sensor on both sides thereof.

3. A current detector comprising:
a Hall-effect sensor for detecting a magnetic field generated by a current flowing across a conductor, said conductor having a separate magnetic element attached thereto as a terminal;
a magnetic core assembly having two leg portions for concentrating a magnetic flux created by the magnetic field, each leg portion having a first end face and a second end face opposite said first end face, said second end face having a smaller area than said first end face, only said second end face being disposed at a position in close proximity to or in abutment against a respective magnetic field detecting surface of said Hall-effect sensor; and
a signal processing circuit for processing an output signal from said Hall-effect sensor into a signal representing the current flowing across said conductor; and
wherein said respective second end faces oppose each other with said Hall-effect sensor disposed therebetween, and a distance between said opposing second end faces is smaller than a distance between opposing distal end faces formed at respective ends of said two leg portions nearest said separate magnetic element attached to said conductor.

4. A current detector comprising:
a Hall-effect sensor for detecting a magnetic field generated by a current flowing across a conductor;
a magnetic core for concentrating a magnetic flux created by the magnetic field and having a first end face and a second end face opposite said first end face, said second end face having an area smaller than said first end face, only said second end face being disposed at a position in close proximity to or in abutment against a magnetic field detecting surface of said Hall-effect sensor; and
a signal processing circuit for processing an output signal from said Hall-effect sensor into a signal representing the current flowing across said conductor; and
wherein said conductor is a U-shaped conductor, and said magnetic core and said Hall-effect sensor are provided on an inner surface of a U-shaped portion of said U-shaped conductor.

5. A current detector comprising:
a Hall-effect sensor for detecting a magnetic field generated by a current flowing across a flat-shaped conductor;
a magnetic core for concentrating a magnetic flux created by the magnetic field and having a first end face and a second end face disposed away from said first end face, said second end face having an area smaller than said first end face, only said second end face being disposed at a position in close proximity to or in abutment against a magnetic field detecting surface of said Hall-effect sensor; and a signal processing circuit for processing an output signal from said Hall-effect sensor into a signal representing the current flowing across said flat-shaped conductor; and
wherein said magnetic core is disposed on at least a bottom face of said flat-shaped conductor and an adjacent side face of said flat-shaped conductor.

6. A current detector comprising:
a Hall-effect sensor for detecting a magnetic field generated by a current flowing across a planar conductor;
a planar magnetic core assembly for concentrating at the Hall-effect sensor a magnetic flux generated by the current flowing across said planar conductor, said planar magnetic core assembly disposed on one side of said planar conductor and having a general V-shape or U-shape formed by two opposing legs of said planar magnetic core assembly, and wherein said Hall-effect sensor is disposed at one end of said planar magnetic core assembly between said two opposing legs; and
a signal processing circuit for processing an output signal from said Hall-effect sensor into a signal representing the current flowing across said planar conductor.

7. The current detector according to claim 6, wherein a cross sectional area of each leg of said planar magnetic core assembly varies in a longitudinal direction of said planar magnetic core.

8. The current detector according to claim 7, wherein a surface of each leg of said planar magnetic core assembly facing said planar conductor has a trapezoidal shape.

9. The current detector according to claim 6, wherein each leg of said magnetic core assembly has a first end face and a second end face opposite said first end face, said second end face having a smaller area than said first end face, only said second end face being disposed at a position in close proximity to or in abutment against a magnetic field detecting surface of said Hall-effect sensor; and wherein said first end face of each leg faces away from said first end face of said other leg, and said second end face of each leg faces said second end face of said other leg with said Hall-effect sensor disposed between said second end faces.

10. The current detector according to claim 6, wherein said legs of said magnetic core assembly are separated from each other by said Hall-effect sensor.

11. The current detector according to claim 6, wherein said planar conductor has a general U-shape with inner opposing surfaces, and wherein said magnetic core assembly and said Hall-effect sensor are disposed on one of said inner opposing surfaces.

12. A current detector comprising:
a Hall-effect sensor for detecting a magnetic field generated by a current flowing across a planar conductor;
a magnetic core assembly for concentrating at the Hall-effect sensor a magnetic flux generated by the current flowing across said planar conductor, said magnetic core assembly comprising two L-shaped portions disposed on said planar conductor, wherein each of said two L-shaped portions is disposed on two sides of said planar conductor, one of said two sides being the same side for both of said L-shaped portions; and wherein said Hall-effect sensor is disposed between said L-shaped portions on said same side of said planar conductor; and
a signal processing circuit for processing an output signal from said Hall-effect sensor into a signal representing the current flowing across said planar conductor.

* * * * *